(12) United States Patent
Yokoyama

(10) Patent No.: US 8,977,327 B2
(45) Date of Patent: *Mar. 10, 2015

(54) COMMUNICATION APPARATUS AND AIR-COOLING METHOD FOR THE SAME

(75) Inventor: Yukihiko Yokoyama, Tokyo (JP)

(73) Assignee: NEC Corporation, Tokyo (JP)

( * ) Notice: Subject to any disclaimer, the term of this patent is extended or adjusted under 35 U.S.C. 154(b) by 244 days.

This patent is subject to a terminal disclaimer.

(21) Appl. No.: 13/617,649

(22) Filed: Sep. 14, 2012

(65) Prior Publication Data

US 2013/0058040 A1    Mar. 7, 2013

Related U.S. Application Data

(63) Continuation of application No. 12/226,190, filed as application No. PCT/JP2007/058394 on Apr. 18, 2007, now Pat. No. 8,374,653.

(30) Foreign Application Priority Data

Apr. 20, 2006  (JP) ................................. 2006-116577

(51) Int. Cl.
   H04M 7/00  (2006.01)
   H05K 7/20  (2006.01)
   H05K 7/18  (2006.01)

(52) U.S. Cl.
   CPC ........ H05K 7/20163 (2013.01); H05K 7/20136 (2013.01); H05K 7/20127 (2013.01); H05K 7/186 (2013.01)
   USPC .......................... 455/575.1; 455/88; 455/90.3

(58) Field of Classification Search
   USPC ............. 455/73, 88, 550.1, 553.1, 90.1–90.3, 455/575.1; 361/688, 695, 697, 703, 679.46, 361/679.47
   See application file for complete search history.

(56) References Cited

U.S. PATENT DOCUMENTS

| 5,526,525 A | 6/1996 | Minowa et al. |
| 6,366,463 B2 | 4/2002 | Hamano |

(Continued)

FOREIGN PATENT DOCUMENTS

| JP | 06-013777 | 1/1994 |
| JP | 08-316675 | 11/1996 |

(Continued)

OTHER PUBLICATIONS

USPTO Notice of Allowance, U.S. Appl. No. 12/226,190, Oct. 5, 2012, 7 pages.

*Primary Examiner* — Dominic E Rego
(74) *Attorney, Agent, or Firm* — Foley & Lardner LLP

(57) ABSTRACT

A communication apparatus and an air-cooling method for the same utilizes an air-cooling mode that can be easily changed to reduce the cost to increase the number of transceiver units and space for the housing. The communication apparatus includes transceiver units installed in a housing and attachable onto and detachable from the communication apparatus and fan units for forcibly air-cooling heat generated from the transceiver units. The fan units are installed in the housing and are attachable onto and detachable from the communication apparatus. Each transceiver unit includes a transceiver function section; a forced air-cooling radiator fixedly mounted in the transceiver function section for forcibly air-cooling heat generated from the transceiver function section; and a natural air-cooling radiator mounted in the transceiver function section for naturally air-cooling heat generated from the transceiver function section. The natural air-cooling radiator is attachable onto and detachable from the main transceiver section.

2 Claims, 4 Drawing Sheets

(56) References Cited

U.S. PATENT DOCUMENTS

| | | |
|---|---|---|
| 6,933,503 B2 | 8/2005 | Sipila et al. |
| 7,115,832 B1 | 10/2006 | Blankenship et al. |
| 7,502,409 B2 | 3/2009 | Kaplan et al. |
| 2002/0186533 A1 | 12/2002 | Sakaiya et al. |
| 2004/0171380 A1 | 9/2004 | Puranik et al. |
| 2004/0192260 A1 | 9/2004 | Sugimoto et al. |
| 2005/0094686 A1 | 5/2005 | Aoki et al. |
| 2006/0178172 A1 | 8/2006 | Yuen |
| 2006/0183505 A1 | 8/2006 | Willrich |
| 2007/0026863 A1 | 2/2007 | Wilson et al. |
| 2007/0064397 A1 | 3/2007 | Chiba et al. |
| 2007/0178950 A1 | 8/2007 | Lewis et al. |
| 2008/0139254 A1 | 6/2008 | Levy |

FOREIGN PATENT DOCUMENTS

| | | |
|---|---|---|
| JP | 2000-013063 A | 1/2000 |
| JP | 2001-313485 A | 11/2001 |
| JP | 2002-111235 A | 4/2002 |
| JP | 2003-324295 A | 11/2003 |
| JP | 2004-140015 A | 5/2004 |

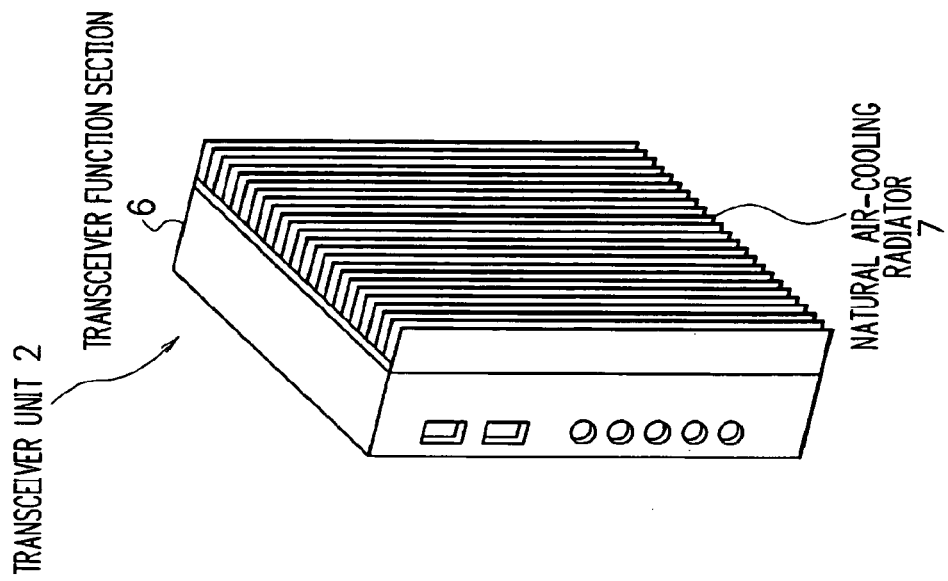
F I G. 1B
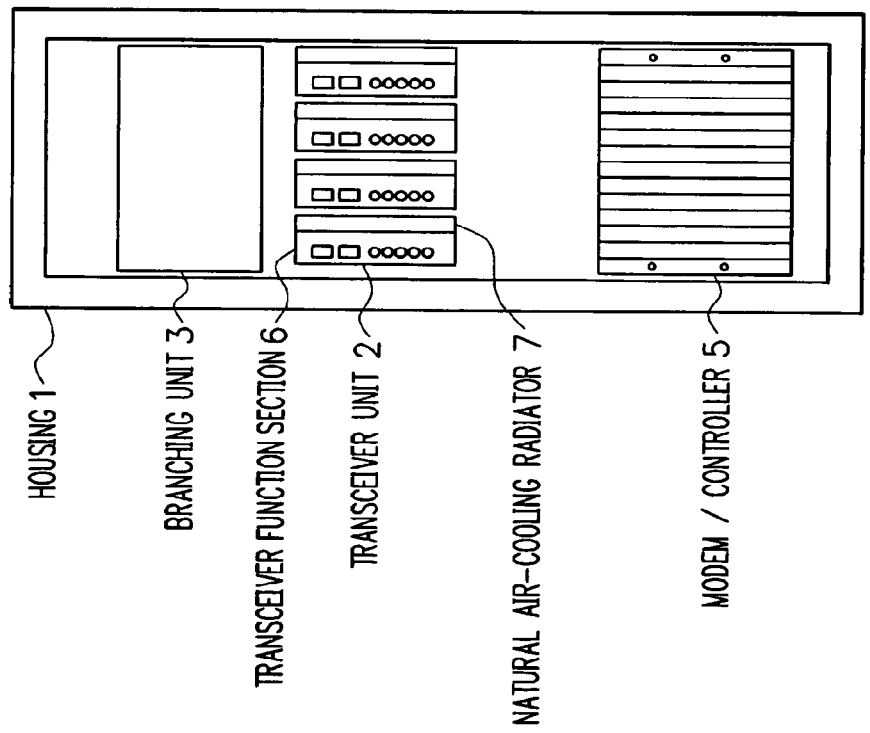
F I G. 1A

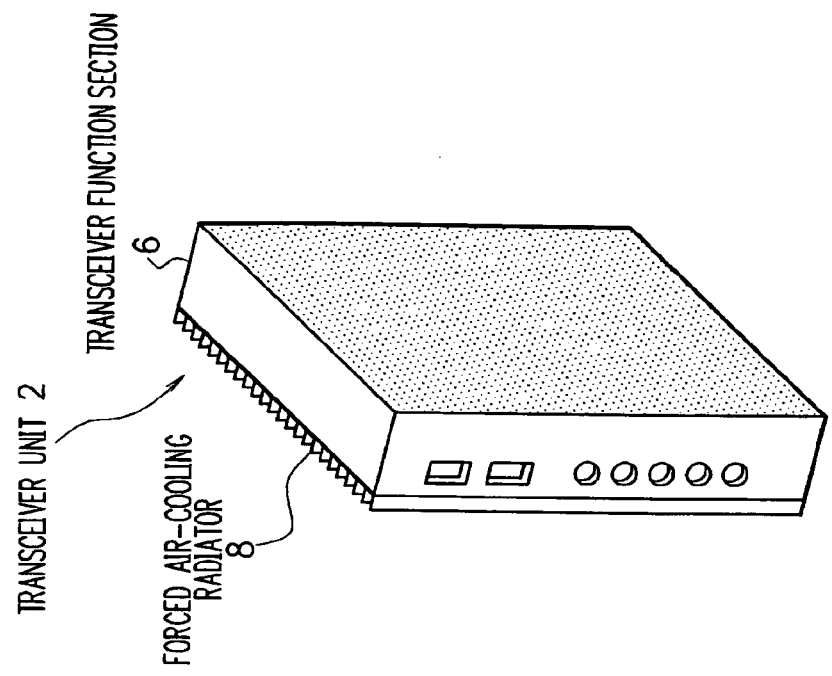
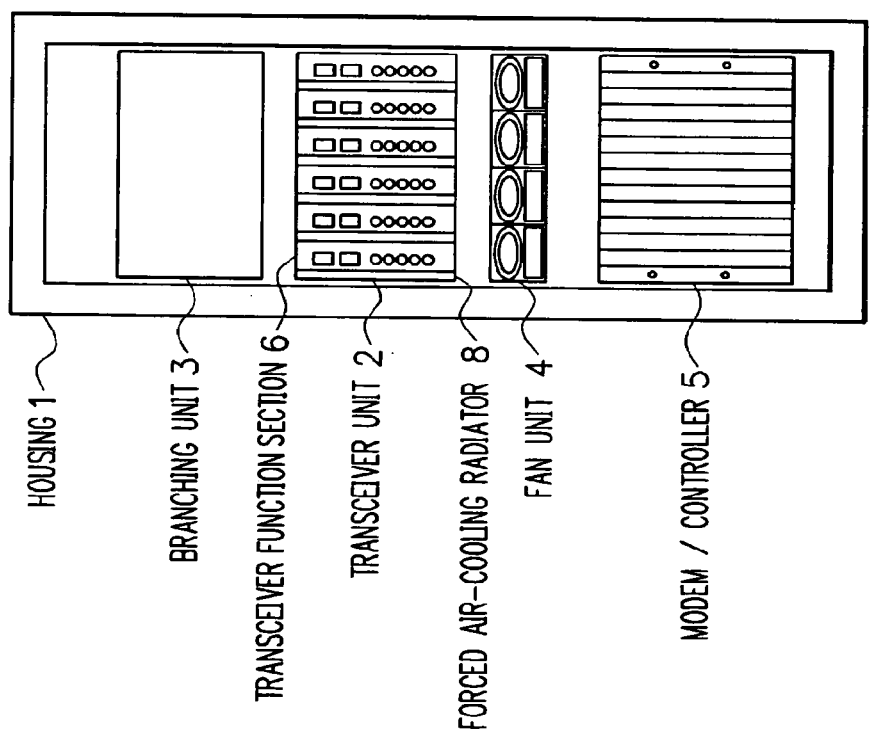

COMMUNICATION APPARATUS AND AIR-COOLING METHOD FOR THE SAME

CROSS-REFERENCE TO RELATED PATENT APPLICATIONS

This application is a continuation of U.S. application Ser. No. 12/226,190, filed Oct. 10, 2008, which is the National Stage of Application No. PCT/JP2007/058394, filed Apr. 18, 2007, which claims benefit of priority from the prior Japanese Application No. 2006-116577, filed on Apr. 20, 2006, the entire contents of all of which are incorporated herein by reference.

TECHNICAL FIELD

The present invention relates to a communication apparatus and an air-cooling method for the same conducting a changeover between air-cooling modes.

BACKGROUND ART

Referring to FIGS. 1 and 2, description will be given of a conventional technique.

The conventional communication apparatus or device, when adopting a natural air-cooling system because of a small number of transceiver units 2, includes a housing 1, i.e., a natural air-cooling rack 1 in which a branching unit 3, a transceiver unit 2 for natural air-cooling, and a modem/controller unit 5 are installed downward in this order as shown in FIG. 1A. In each transceiver unit 2 in FIG. 1B, heat is radiated from a natural air-cooling radiator 7. If a large number of transceiver units 2 are packed into the conventional apparatus and hence forced air-cooling is employed to cope with high-density mounting of the transceiver units 2. The housing 1 includes a branching unit 3, a transceiver unit 2 for forced air-cooling, and a modem/controller unit 5 that are arranged from the top in this order as shown in FIG. 2A. When a fan unit 4, which is disposed above or below transceiver units 2 shown in FIG. 2B, is activated, heat is radiated from the forced air-cooling radiator 8 of the transceiver unit 2.

As for an example of the conventional technique using natural air-cooling, specifically, a "microwave communication device" that radiates heat by means of radiation fins attached to a housing (for example, Japanese Patent Application Laid-Open No. 2000-13063). Also, there is described an example of the conventional art using forced air-cooling, namely, a "communication device mounting structure and heat radiation method for the same" in which heat is radiated from the device via heat radiation fins while fans suctions air (for example, Japanese Patent Application Laid-Open No. 2004-140015).

DISCLOSURE OF THE INVENTION

Problem to be Solved by the Invention

However, if more transceiver units 2 are needed but are already packed fully, there is a problem that an additional housing 1 must be installed. To densely install the transceiver unit 2 by changing the cooling mode of the housing 1 from the natural air-cooling mode to the forced air-cooling mode, it is necessary to prepare transceiver units 2 for forced air-cooling (FIG. 2B) as many as the existing units having been already installed, instead of the transceiver unit 2 for natural air-cooling (FIG. 1B), which has been already installed. This causes the increase in the cost.

The present invention is made in consideration of the above condition, and an object of the present invention is to provide a communication apparatus and an air-cooling method for the same wherein an air-cooling mode is easily changed, the cost for adding transceiver units is reduced, and the space for the housing is effectively used.

Means for Solving the Problems

In order to achieve the object, According to a first aspect of the present invention, a communication apparatus includes a transceiver unit of a transmission system for performing transmission and reception in a housing, being attachable onto and detachable from the communication apparatus; a fan unit for forcibly air-cooling heat generated from the transceiver unit in the housing, being attachable onto and detachable from the communication apparatus. The transceiver unit has a transceiver function section including a transceiver function, a forced air-cooling radiator fixedly mounted in the transceiver function section for forcibly air-cooling heat generated from the transceiver function section, and a natural air-cooling radiator for naturally air-cooling heat generated from the transceiver function section, being attachable onto and detachable from the transceiver function section.

According to an second aspect of the present invention, a communication apparatus includes: an (n+1) wireless backup changeover function including a current transmission system and N backup transmission systems; a modem unit in a housing, including a modulation function for modulating an input baseband signal into an intermediate-frequency signal and a demodulation function for demodulating an intermediate-frequency signal into a baseband signal; a transceiver unit in the housing, including a transmitting function for converting an intermediate-frequency signal into a radio-frequency signal and for supplying the radio-frequency signal to an antenna and a receiving function for receiving a radio-frequency signal and converting the radio-frequency signal into an intermediate-frequency signal; a branching unit in the housing for separating a desired radio frequency from radio frequencies allocated thereto; a control unit in the housing, including a line changeover function to conduct a changeover operation between communication lines respectively of the current transmission system and the backup transmission systems, a line control function for monitoring the communication lines and controlling operation of the line changeover function according to a state monitored as above, and a monitor function for monitoring a state of the apparatus; and a fan unit in the housing for forcibly air-cooling heat generated from the transceiver unit. The transceiver unit and the fan unit are attachable onto and detachable from the housing. The transceiver unit includes a transceiver function section having a transceiver function, a forced air-cooling radiator fixedly installed on the transceiver function section for forcibly air-cooling heat generated from the transceiver function section, and a natural air-cooling radiator for naturally air-cooling heat generated from the transceiver function section, being attachable onto and detachable from the transceiver function section.

According to a third aspect of the present invention, if the natural air-cooling is conducted, the fan unit may be removed from the housing, and the transceiver unit may be mounted as transceiver unit for natural air-cooling in the housing.

According to a fourth aspect of the present invention, if the forced air-cooling is conducted, the natural air-cooling radiator may be removed from the transceiver function section, and the transceiver unit may be mounted as a transceiver unit for forced air-cooling in the housing.

According to a fifth aspect of the present invention, the transceiver function section may be substantially a parallelepiped, the forced air-cooling radiator is fixedly attached on a first surface of the transceiver function section, and the natural air-cooling radiator is attachable onto and detachable from a second surface of the transceiver function section, the second surface being opposite to the first surface.

According to a sixth aspect of the present invention, there is provided an air-cooling method for use with a communication apparatus including a transceiver unit of a transmission system for performing transmission and reception in a housing, being attachable onto and detachable from the communication apparatus; and a fan unit for forcibly air-cooling heat generated from the transceiver unit, the fan unit in the housing, being attachable onto and detachable from the communication apparatus. The transceiver unit includes a transceiver function section having a transceiver function; a forced air-cooling radiator fixedly mounted in the transceiver function section for forcibly air-cooling heat generated from the transceiver function section; and a natural air-cooling radiator mounted for naturally air-cooling heat generated from the transceiver function section, being attachable onto and detachable from the transceiver function section. The air-cooling method includes the steps of removing from the housing, if the natural air-cooling is conducted, the fan unit and mounting the transceiver unit as a transceiver unit for natural air-cooling in the housing; and removing from the transceiver function section, if the forced air cooling is conducted, the natural air-cooling radiator and mounting the transceiver unit as a transceiver unit for forced air-cooling in the housing.

According to a seventh aspect of the present invention, there is provided an air-cooling method for use with a communication apparatus including an (n+1) wireless backup changeover function including a current transmission system and N backup transmission systems; a modem unit in a housing, including a modulation function for modulating an input baseband signal into an intermediate-frequency signal and a demodulation function for demodulating an intermediate-frequency signal into a baseband signal; a transceiver unit in the housing, including a transmitting function for converting an intermediate-frequency signal into a radio-frequency signal and for supplying the radio-frequency signal to an antenna and a receiving function for receiving a radio-frequency signal and for converting the radio-frequency signal into an intermediate-frequency signal; a branching unit in the housing for separating a desired radio frequency from radio frequencies allocated thereto; a control unit in the housing, including a line changeover function to conduct a changeover operation between communication lines respectively of the current transmission system and the backup transmission systems, and a line control function for monitoring the communication lines and controlling operation of the line changeover function according to a state monitored as above, and a monitor function for monitoring a state of the apparatus; and a fan unit in the housing for forcibly air-cooling heats from the transceiver unit. The transceiver unit and the fan unit are attachable onto and detachable from the housing, the transceiver unit includes a transceiver function section having a transceiver function, a forced air-cooling radiator fixedly installed on the transceiver function section for forcibly air-cooling heat generated from the transceiver function section, and a natural air-cooling radiator being attachable onto and detachable from the transceiver function section for naturally air-cooling heat generated from the transceiver function section. The air-cooling method includes the steps of removing from the housing, if the natural air-cooling is conducted, the fan unit and mounting the transceiver unit as a transceiver unit for natural air-cooling in the housing; and removing from the transceiver function section, if the forced air-cooling is conducted, the natural air-cooling radiator and mounting the transceiver unit as a transceiver unit for forced air-cooling in the housing.

According to an eighth aspect of the present invention, the transceiver function section may be substantially a parallelepiped, the forced air-cooling radiator is fixedly attached on a first surface of the transceiver function section, and the natural air-cooling radiator is attachable onto and detachable from a second surface of the transceiver function section, the second surface being opposite to the first surface.

Effect of the Invention

In accordance with the present invention, in a situation wherein if the number of transceiver units to be installed in a housing is increased and hence the radiating mode using forced air-cooling is required due to insufficient heat radiation by natural air-cooling, it is not required to prepare transceiver units for forced air-cooling. Only by removing the natural air-cooling radiators of the existing transceiver units installed in the housing, the transceiver units can be used as transceiver units dedicated to forced air-cooling. Only by additionally installing fan units in the housing, it is possible to employ the housing as a housing dedicated to forced air-cooling. Resultantly, the transceiver units initially installed in the housing can be efficiently used and hence the cost for the additional installation is expectedly lowered.

In association with the installation of the additional transceiver units, it is not required to install a new housing. This advantageously saves the installation space.

BEST MODE FOR CARRYING OUT THE INVENTION

Features of the disclosed embodiments will be described by way of the following detailed description with reference to the accompanying drawings.

Exemplary Embodiment

As can be seen from FIG. 3A, a communication apparatus of the present embodiment includes a current transmission system and N backup transmission systems to configure an (N+1) wireless backup changeover function. A housing 1 includes a transceiver unit (a signal transmission and reception section) 2, a branching unit 3, and a modem/controller (modem and control panel section) 5. The unit 3 is placed above the unit 2. The modem/controller 5 is separated from those units and is arranged below the unit 2.

The branching unit 3 includes a function to separate a desired wireless frequency from wireless frequencies allocated thereto.

The modem/controller 5 includes a modulation and demodulation function, i.e., a modulation function to modulate an input baseband signal into a signal of an intermediate frequency and a demodulation function to demodulate a signal of an intermediate frequency received from the transceiver unit 2 into a baseband signal. The modem/controller 5 also includes a control function, specifically, a line changeover function to conduct a changeover operation between lines of the current transmission system and the backup transmission system, a line control function to monitor the lines to control operations of the line changeover function according to the states of the lines, and a monitoring function to monitor and display a state of the communication apparatus or device. Although, in the present embodiment, the modem/controller 5 includes the modem function and the control function, two units may be adopted to conduct these functions respectively.

The unit 2 is a unit attachable onto and detachable from the housing 1. As shown in FIG. 3B, a transceiver function section 6 with substantially a parallelepiped is arranged at a central position of the unit 2. On surfaces of mutually opposing sides of the transceiver function section 6, a radiator 7 for natural air-cooling and a radiator 8 for forced air-cooling are disposed to let out heat generated by the transceiver function section 6. The transceiver function section 6 includes a transmitting function to convert an intermediate-frequency signal from the modem/controller 5 into a radio-frequency signal and supplies the signal to an antenna, not shown, and a receiving function to receive a radio-frequency signal to convert the radio-frequency signal into an intermediate-frequency signal. The radiator for forced air-cooling 8 is fixedly attached on the transceiver function section 6. The radiator for natural air-cooling 7 is attachable onto and detachable from the transceiver function section 6.

When the communication apparatus is activated, the quantity of heat generated from the transceiver unit 2 increases as a result of signal transmission and reception. The heat is transferred from the transceiver unit 2 (the transceiver function section 6) to the natural-air-cooling radiator 7 to be naturally radiated upward.

In a layout in which a plurality of transceiver units 2 is mounted in the housing 1 and adjacent units 2 are likely to be mutually influenced by heat radiated from each other, a fan unit 4 being attachable onto and detachable from the housing 1 is installed below or above the unit 2 as shown in FIG. 4A. By driving the fan unit 4, the heat is radiated upward more efficiently. The fan unit 4 sucks air to radiate the heat from an opening thereof, not shown, to the outside of the communication apparatus.

In a situation wherein the heat is radiated by the forced air-cooling using the fan unit 4, the radiator for natural air-cooling 7 mounted on the transceiver unit 2 is removed as shown in FIG. 4B and is then installed as a transceiver unit for forced air-cooling 2 in the housing 1 as shown in FIG. 4A.

Since the fan unit 4 provides a wind flow rate required to radiate heat from the radiator for forced air-cooling 8, the mounting density of the units 2 is increased and the units 2 can be sufficiently cooled even though the heat radiation capacity is lowered due to the removal of the radiators for natural air-cooling 7.

As set forth above, when the number of transceiver units 2 is increased in the housing 1 and it is required to employ the heat radiation of forced air-cooling because the heat radiation by natural air-cooling is insufficient, the user need not prepare transceiver units dedicated to the forced air-cooling. It is only required to remove the natural air-cooling radiators 7 of the existing transceiver units 2 so that the resultant transceiver units 2 are operated as the transceiver units dedicated to forced air-cooling. Only by adding the fan units 4 to the housing 1, it is possible to employ the housing 1 as a housing dedicated to forced air-cooling.

Resultantly, the initially installed transceiver units can be efficiently used, which lowers the cost for the additional installation of units.

Since a new housing 1 need not be additionally installed even if the number of the transceiver units 2 is increased, the installation space is advantageously saved.

If the number of transceiver units 2 actually installed is small and hence the heat radiation by forced air-cooling is not required, the components for forced air-cooling such as the fan units 4 are not required to be mounted in advance. This results in not requiring an extra initial installation cost of the communication apparatus.

Description has been given of embodiments in accordance with the present invention. However, the present invention is not restricted by the embodiments. The embodiments can be modified and changed in various ways within the scope of the present invention.

INDUSTRIAL APPLICABILITY

The present invention is generally applicable to apparatus and devices that require heat radiation or air-cooling operation.

BRIEF DESCRIPTION OF THE DRAWINGS

FIG. 1A is a diagram showing a configuration of a conventional communication apparatus for natural air-cooling;

FIG. 1B is a perspective view showing an appearance of a transceiver unit for natural air-cooling;

FIG. 4A is a diagram showing a configuration of a communication apparatus according to an exemplary embodiment of the present invention in forced air-cooling; and FIG. 4B is a perspective view showing an appearance of a transceiver unit according to an exemplary embodiment of the present invention in forced air-cooling.

DESCRIPTION OF REFERENCE NUMERALS

Figure 2B:
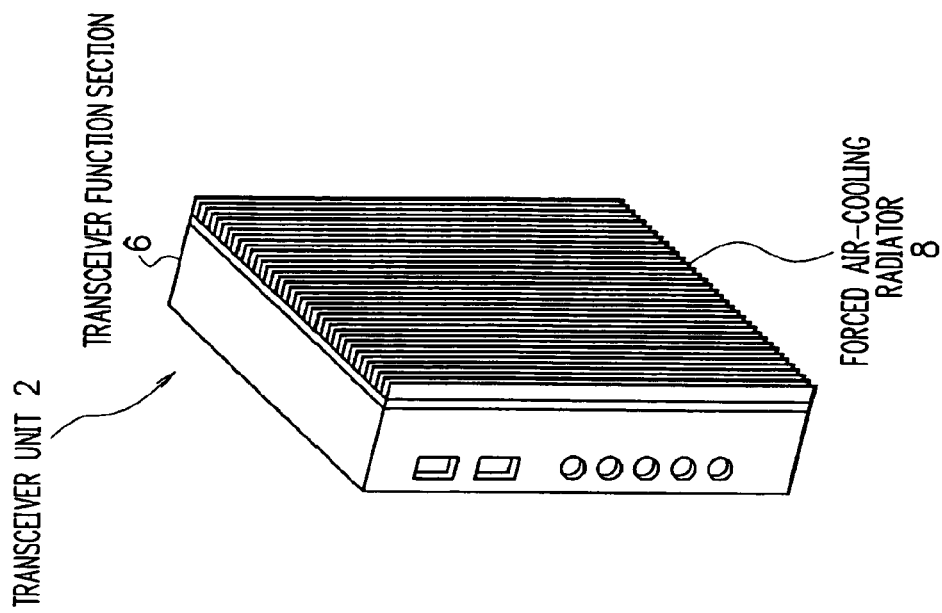
FIG. 2B is a perspective view showing an appearance of a transceiver unit for forced air-cooling.
Figure 2A:
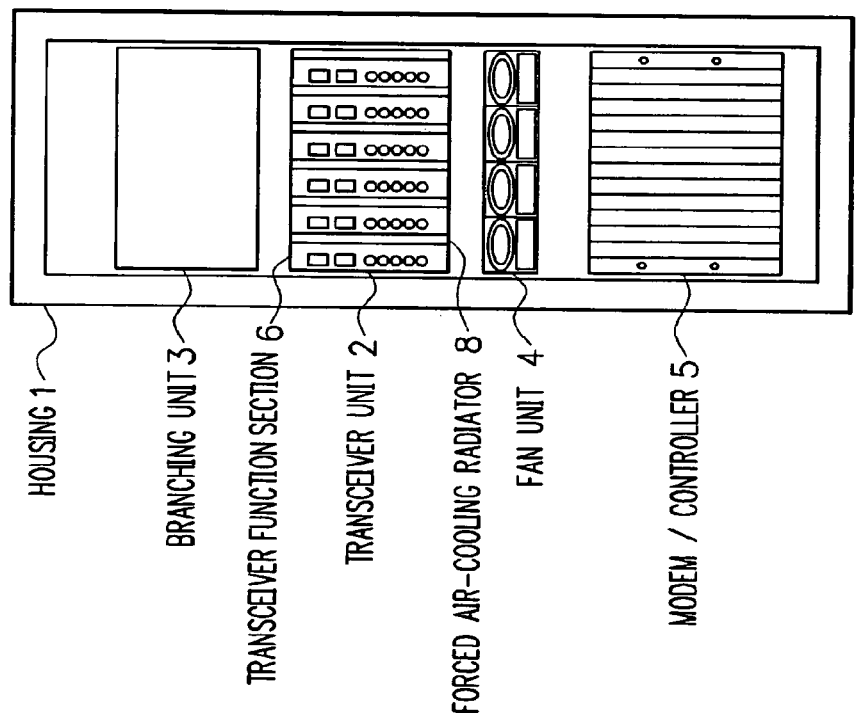
FIG. 2A is a diagram showing a configuration of a conventional communication apparatus for forced air-cooling.
Figure 3B:
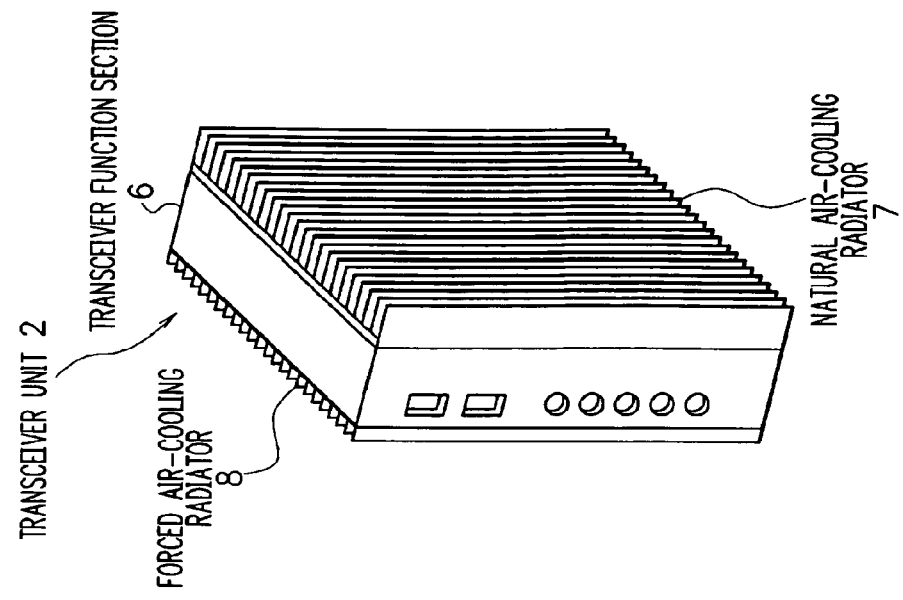
FIG. 3B is a perspective view showing an appearance of a transceiver unit according to an exemplary embodiment of the present invention in natural air-cooling.
Figure 3A:
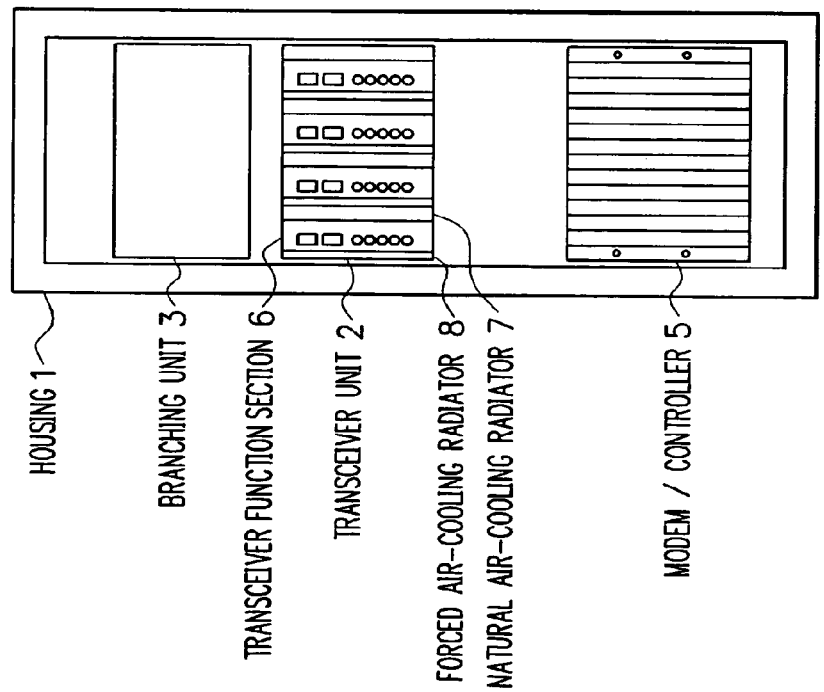
FIG. 3A is a diagram showing a configuration of a communication apparatus according to an exemplary embodiment of the present invention in natural air-cooling.

1 Housing
2 Transceiver unit
3 Branching unit
4 Fan unit
5 Modem/controller unit
6 Transceiver function section
7 Radiator for natural air-cooling
8 Radiator for forced air-cooling

The invention claimed is:

1. A communication apparatus, comprising:
a plurality of transceiver units, on each of which a natural air-cooling radiator is attachably and detachably mounted and a forced air-cooling radiator is fixedly mounted,
wherein said natural air-cooling radiator is detached depending on a number of the plurality of transceiver units, and said transceiver units from which said natural air-cooling radiators are detached are installed as transceiver units for forced air-cooling in a housing.

2. A method of air-cooling a communication apparatus, which includes a plurality of transceiver units, the method comprising the steps of:
detaching a natural air-cooling radiator from said transceiver unit, on which said natural air-cooling radiator is attachably and detachably mounted and a forced air-cooling radiator is fixedly mounted, depending on a number of the plurality of the transceiver units; and installing said transceiver units from which said natural air-cooling radiator are detached as transceiver units for forced air-cooling in a housing.

* * * * *